(12) United States Patent  (10) Patent No.: US 9,109,876 B2
De Boer et al.  (45) Date of Patent: Aug. 18, 2015

(54) DEVICE FOR MEASURING A FLUID MENISCUS

(75) Inventors: Bart Michiel De Boer, Eindhoven (NL); Thomas Jan De Hoog, Eindhoven (NL); Theodorus Petrus Henricus Gerardus Jansen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 625 days.

(21) Appl. No.: 13/126,035

(22) PCT Filed: Oct. 27, 2009

(86) PCT No.: PCT/IB2009/054758
§ 371 (c)(1),
(2), (4) Date: Apr. 26, 2011

(87) PCT Pub. No.: WO2010/061300
PCT Pub. Date: Jun. 3, 2010

(65) Prior Publication Data
US 2011/0204902 A1  Aug. 25, 2011

(30) Foreign Application Priority Data
Nov. 3, 2008 (EP) .................................. 08168167

(51) Int. Cl.
  *G01R 27/26* (2006.01)
  *G01B 7/28* (2006.01)
  *G02B 26/00* (2006.01)
(52) U.S. Cl.
  CPC .............. *G01B 7/28* (2013.01); *G01R 27/2605* (2013.01); *G02B 26/005* (2013.01)
(58) Field of Classification Search
  CPC .......... G02B 3/14; G02B 1/06; G02B 26/005; G01R 27/2605; G01B 7/28
  USPC ................................... 324/663, 671, 658
  See application file for complete search history.

(56) References Cited

U.S. PATENT DOCUMENTS 3,774,237 A * 11/1973 Hardway, Jr. ................. 324/663
7,019,679 B2    3/2006 Mulder et al.
(Continued)

FOREIGN PATENT DOCUMENTS

EP         097570 A2    1/1984
EP        1906213 A1    4/2008
(Continued)

OTHER PUBLICATIONS

By L. Bernard et al.,"Optimization of a Probe for the Spectroscopic Electrical Characterization of Biologiical Tissues" Criteria: (Abstract) (Reduction of parasitic capacitance by modifying the geometry of the probe) European Physical J. Appl. Phy. 39 (2), Aug. 2007, pp. 171-174.

*Primary Examiner* — Amy He

(57) ABSTRACT

A device for measuring a geometry of a fluid meniscus includes a fluid chamber storing a first electrically conductive fluid and a second electrically insulating fluid. The fluids are mutually immiscible and define a fluid meniscus in between them. The device further includes a main electrowetting electrode and auxiliary electrowetting electrodes for controlling the geometry of the fluid meniscus. A voltage source provides a voltage between the main electrowetting electrode and the auxiliary electrowetting electrodes and a measurement circuit separately measures capacitances between the main electrowetting electrode and at least two of the auxiliary electrowetting electrodes. The measurement circuit includes a multiplexer for demodulating a signal indicative for the capacitances.

15 Claims, 7 Drawing Sheets

(56) References Cited

U.S. PATENT DOCUMENTS

| | | |
|---|---|---|
| 7,440,075 B2 | 10/2008 | Hendriks et al. |
| 8,422,338 B2 | 4/2013 | Kuiper et al. |
| 2002/0140370 A1 | 10/2002 | Sun |
| 2002/0167971 A1* | 11/2002 | Van Stralen et al. .......... 370/535 |
| 2002/0176148 A1 | 11/2002 | Onuki et al. |
| 2005/0041301 A1 | 2/2005 | Kibayashi |
| 2005/0277836 A1 | 12/2005 | Prolux et al. |
| 2007/0299625 A1 | 12/2007 | Englert et al. |
| 2008/0100905 A1 | 5/2008 | Kato et al. |
| 2008/0239450 A1* | 10/2008 | Immink et al. ................ 359/254 |
| 2008/0265037 A1 | 10/2008 | 'T'Hooft et al. |

FOREIGN PATENT DOCUMENTS

| | | |
|---|---|---|
| GB | 2279756 A1 | 11/1995 |
| JP | 09145760 | 6/1997 |
| JP | 2006170797 A | 6/2006 |
| WO | 2006035407 A1 | 4/2006 |
| WO | 2006048187 A1 | 5/2006 |
| WO | 2008026179 A2 | 3/2008 |

* cited by examiner

DEVICE FOR MEASURING A FLUID MENISCUS

FIELD OF THE INVENTION

The invention relates to a device for measuring a geometry of a fluid meniscus.

The invention further relates to a catheter comprising such a device.

The invention further relates to a method for measuring a geometry of a fluid.

BACKGROUND OF THE INVENTION

In WO 2006/035407 A1, a controllable optical lens system is disclosed. Said system comprises a lens having a chamber housing first and second fluids, wherein the interface between the fluids define a lens surface. The system further comprises an electrode arrangement comprising a first electrode and a second electrode for electrically controlling the shape of the lens surface, a feedback control loop for controlling the electrode arrangement based on a signal provided by a capacitance sensing arrangement, which capacitance sensing arrangement serves for measuring a capacitance between the first and second electrodes.

The techniques disclosed in WO2006/035407 A1 are less suitable for generating specific geometries for the fluid meniscus, e.g. an inclined flat meniscus or a symmetrical concave or convex shape.

SUMMARY OF THE INVENTION

It is an object of the invention to provide a device as described in the preamble for more accurately measuring the geometry of the fluid meniscus. This object is achieved by the device according to the invention, the device comprising a fluid chamber comprising a first fluid and a second fluid, which first fluid is electrically conductive, which second fluid is electrically insulating, and which first and second fluids are mutually immiscible and in contact with each other over a fluid meniscus, a main electrowetting electrode located in a main plane and auxiliary electrowetting electrodes partially surrounding the fluid chamber and being located in an auxiliary plane, for controlling the geometry of the fluid meniscus, a voltage source for providing a voltage between the main electrowetting electrode and a plurality of auxiliary electrowetting electrodes, and a measurement circuit for separately measuring capacitances between a main electrowetting electrode and at least two of the auxiliary electrowetting electrodes, the measurement circuit comprising a multiplexer for demodulating a signal indicative for said capacitances.

Through providing a plurality of auxiliary electrowetting electrodes, and by measuring the capacitances between the main electrowetting electrode and at least two of the auxiliary electrowetting electrodes, the geometry of the fluid meniscus advantageously allows for more accurate determination. Said auxiliary electrowetting electrodes are mutually electrically connected via the electrically conductive first fluid comprised in the fluid chamber. Hence, depending on the first fluid's characteristics, there is significant interaction between the auxiliary electrowetting electrodes. The interaction between the auxiliary electrodes impedes the determination of a single capacitance. Namely, due to said interaction the signal representative for the capacitances between the main electrowetting electrode and the auxiliary electrowetting electrodes indicates an overall characteristic. To counteract the consequences of the interaction between the auxiliary electrowetting electrodes, the device according to the invention provides a multiplexer for demodulating the signal representative for the capacitances between the main electrowetting and each of the auxiliary electrowetting electrodes. More specifically, said signal is decomposed into components representative for the capacitances associated with separate auxiliary electrowetting electrodes. Consequently, the capacitances between the main electrowetting electrodes and at least two of the auxiliary electrodes are amenable for separate measuring. Namely, more information regarding an actual geometry of the fluid meniscus is available. As a result, the device according to the invention enables a more accurate measuring of a fluid meniscus' geometry.

In a preferred embodiment of the device according to the invention, the measurement circuit is arranged for measuring the capacitances between the main electrowetting electrode and each of the auxiliary electrowetting electrodes. The advantage of this is that more information regarding the geometry of the fluid meniscus will become available.

In a preferred embodiment of the device according to the invention, the device comprises a voltage control circuit for controlling the voltage provided between the main electrowetting electrode and each of the auxiliary electrowetting electrodes based on a control signal provided by the measurement circuit. The benefit of this feature is in compensating deviations between an actual geometry of the fluid meniscus and a required geometry of the fluid meniscus. Said deviations may result from the possible presence of manufacturing tolerances or in situ modifications of the fluids comprised in the fluid chamber due to e.g. temperature changes. Furthermore, a deviation is caused due to a change of the fluid chamber's orientation with regard to the gravity field in case a first fluid's density differs from a second fluid's density. The voltage control circuit effectuates compensation of the aforementioned deviations by comparing the signal provided by the measurement circuit with a set point signal, which set point signal represents the required fluid meniscus geometry, and by subsequently providing an appropriate voltage between the main electrowetting electrode and each of the auxiliary electrowetting electrodes on the basis of a possible difference between the signal provided by the measurement circuit and the set point signal.

In a further preferred embodiment of the device according to the invention, the measurement circuit comprises an operational amplifier for measuring capacitances between the main electrowetting electrode and at least two of the auxiliary electrowetting electrodes. The operational amplifier is provided with a negative feedback, which negative feedback loop is provided with a predetermined measurement capacitance, wherein the operational amplifier is arranged for cooperation with an input of the multiplexer. The advantage of the measurement circuit of the involved embodiment is in its ability to counteract disturbing effects due to possible parasitic capacitances, which possible parasitic capacitances impede the accurate measuring of the capacitances between the main electrowetting electrode and each of the auxiliary electrowetting electrodes.

A potential source of such a parasitic capacitance is a co-axial measuring cable. The involved embodiment of the device according to the invention may therefore be particularly beneficial for applications wherein an arrangement of the fluid chamber, the main electrowetting electrode and the auxiliary electrowetting electrodes is remotely located from the measuring circuit. Herein, said arrangement and said measurement circuit are preferably mutually connected via a co-axial cable. An example of such an application is given by a catheter, wherein said arrangement is mounted in a catheter's tip for redirecting an ultrasound and/or a laser beam during scanning. Given the relatively small dimensions of the catheter's tip, the measurement circuit cannot be integrated into said catheter's tip. Hence, a further advantage of this embodiment is in the fact that it enables the utilization of the device in a catheter.

In this particular example, each of the auxiliary electrowetting electrodes is accompanied by at least one parasitic capacitance. In addition to that, the parasitic capacitances are interconnected. Namely, the capacitances between the main electrowetting electrode and the auxiliary electrowetting electrodes mutually interact via the first and second fluids comprised in the fluid chamber. In addition to that, the parasitic capacitances are non-constant due to bending movements of the co-axial cable during use.

In a further embodiment of the device according to the invention, the measurement circuit comprises a switching circuit comprising a first measurement capacitor having a predetermined first measurement capacitance, and a second measurement capacitor having a predetermined second measurement capacitance, wherein the first and second measurement capacitances are mutually different, the switching circuit further comprising a switch for driving the first and second measurement capacitors in an alternating way and mutually excluding way, wherein the switching circuit is arranged for cooperation with an input of the multiplexer. The advantage of the measurement circuit of the involved embodiment is in its capability of cancelling the disturbing effects due to possible parasitic capacitances, which possible parasitic capacitances hinder the accurate measuring of the capacitances between the main electrowetting electrode and the auxiliary electrowetting electrodes.

In a preferred embodiment of the device according to the invention, the multiplexer is a frequency domain multiplexer and the voltage source is arranged for providing voltages at specific frequencies. The frequency domain multiplexer demodulates the signal representative for the capacitances between the main electrowetting electrode and the auxiliary electrowetting electrodes by employing demodulation signals each having a frequency component corresponding to the frequencies at which the respective auxiliary electrowetting electrodes are being driven by the voltage source.

In a practical embodiment of the device according to the invention, the multiplexer is a time domain multiplexer. The time domain multiplexer demodulates the signal representative for the capacitances between the main electrowetting electrode and the auxiliary electrowetting electrodes through employing demodulation signals, wherein each demodulation signal is a square wave signal having a low value and a high value. The voltage source comprises voltage switches for alternatingly disconnecting the voltages corresponding to the high values of the respective demodulating values. In case a square wave signal attains its low value, the respective voltage is disconnected by a respective voltage switch. When a square wave signal attains its high value, the respective voltage is connected through the accompanying voltage switch.

In a further practical embodiment of the device according to the invention, the first fluid provides a first speed of sound and the second fluid provides a second speed of sound, wherein the first and second speeds of sound are mutually different. That is, the speed of sound across the first fluid has a first value and the speed of sound across the second fluid has a second value, wherein the first and second values are mutually different. As a result, through appropriately controlling the geometry of the fluid meniscus, the fluid meniscus is capable of redirecting sound. A possible application of the involved embodiment is in controlling the direction of an ultrasound beam.

In a further practical embodiment of the device according to the invention, the first fluid has a first refractive index and the second fluid has a second refractive index, wherein the first and second refractive indices are different. As a result, through appropriately controlling the geometry of the fluid meniscus, the fluid meniscus is capable of redirecting electromagnetic radiation, for instance a laser beam.

It is a further object of the invention to provide a method for measuring a geometry of a fluid meniscus between an electrically conducting first fluid and an electrically insulating second fluid comprised in a fluid chamber, the fluids being mutually immiscible, comprising the steps of providing a voltage between a main electrowetting electrode located in a main plane and auxiliary electrowetting electrodes partially surrounding the fluid chamber and being located in auxiliary planes, and separately measuring capacitances between the main electrowetting electrode and at least two of the auxiliary electrowetting electrodes by a measurement circuit comprising a multiplexer.

In a preferred embodiment of the method according to the invention, a step is provided for controlling the voltage applied to the auxiliary electrowetting electrodes, wherein said voltage is based on a signal provided by the measurement circuit.

It is a further object of the invention to provide a catheter for real time control of the direction of sound and/or electromagnetic radiation. This object of the invention is achieved by the catheter according to the invention, which catheter is provided with the device according to the invention.

DETAILED DESCRIPTION OF THE EMBODIMENTS

Figure 1A:
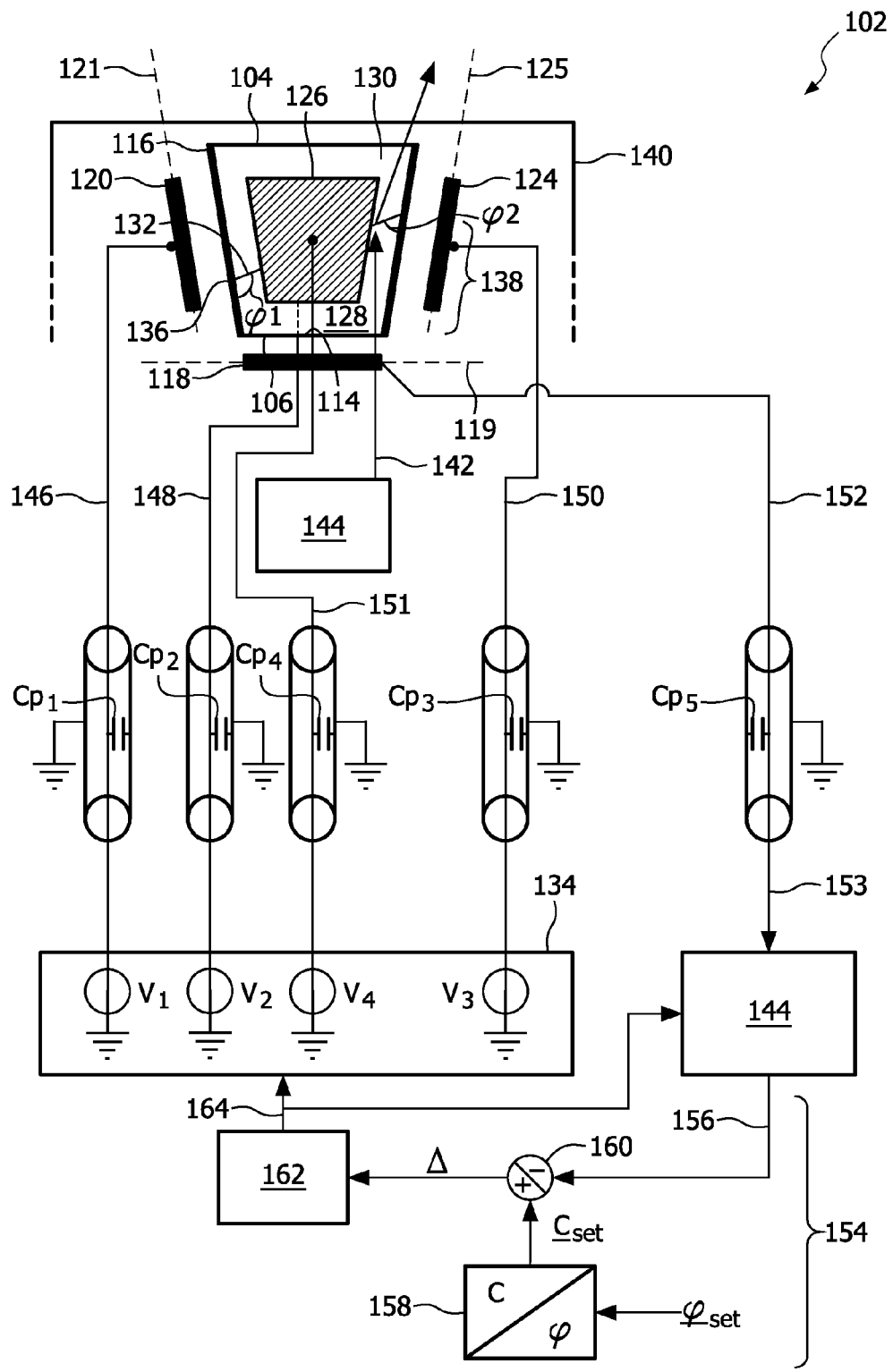
FIG. 1A schematically depicts in cross section a device comprising a fluid chamber, a main electrowetting electrode and auxiliary electrowetting electrodes.
Figure 1B:
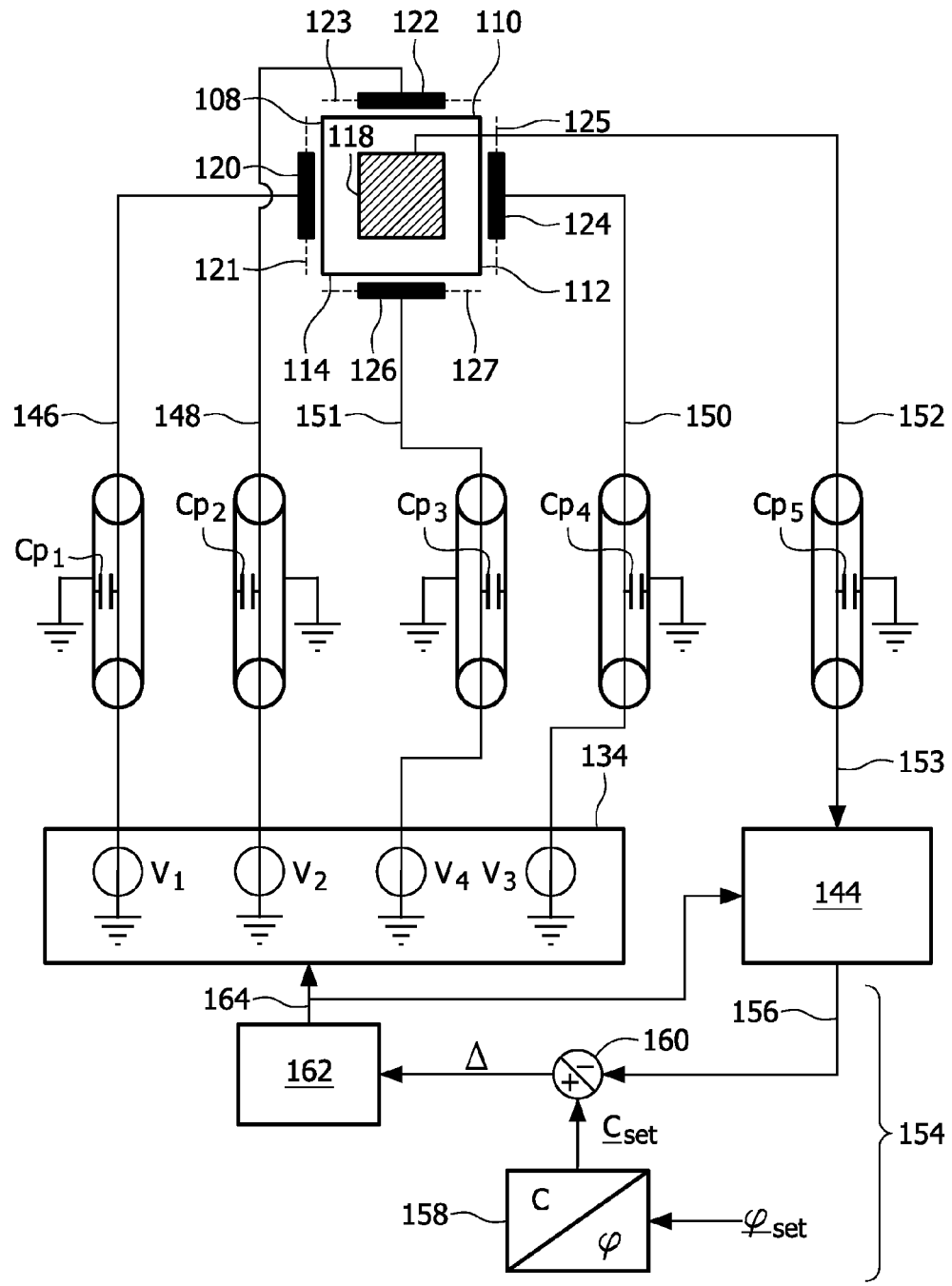
FIG. 1B schematically shows a bottom view of the device depicted in FIG. 1A.
Figure 2:
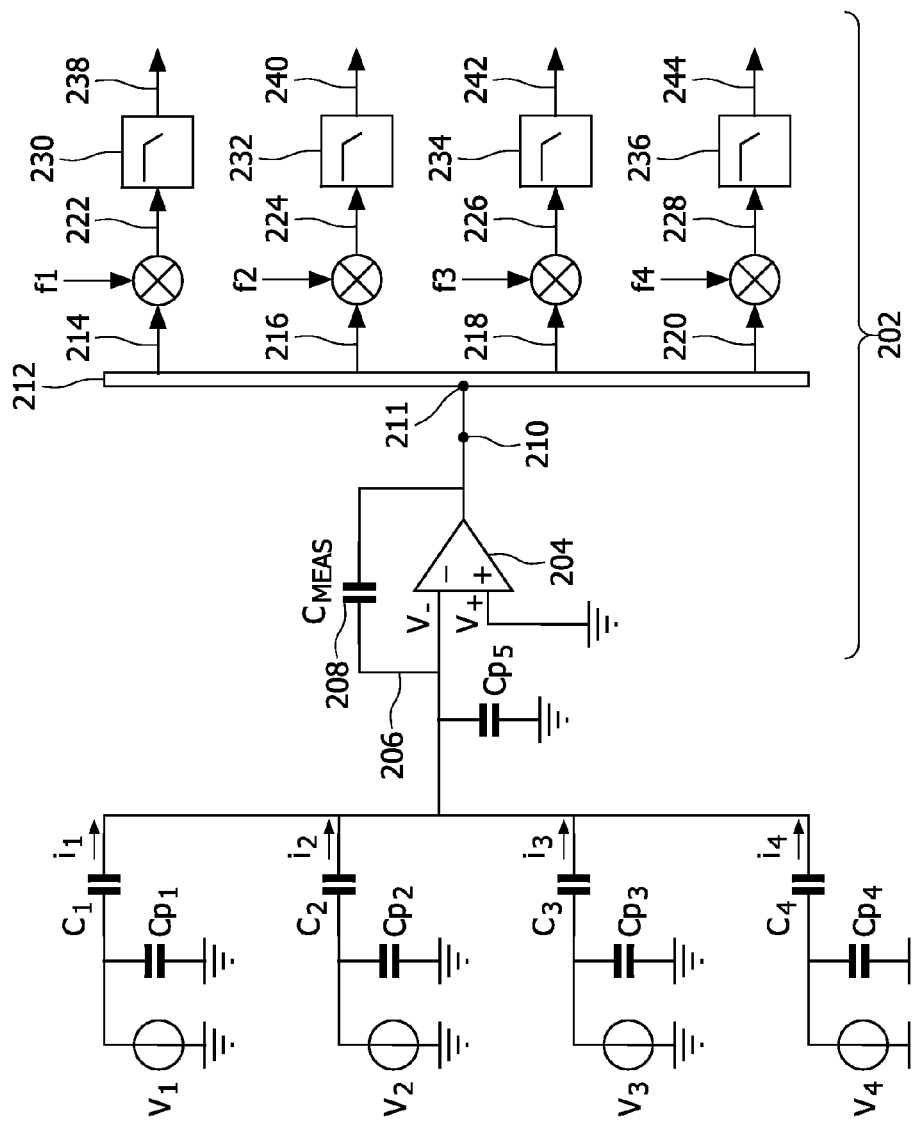
FIG. 2 schematically displays a model for the electrical behavior of an electrowetting lens together with co-axial cables and a measurement circuit, the measurement circuit being applied into the device according to FIG. 1A and FIG. 1B.

A first embodiment of the device according to the invention is depicted in FIG. 1A, FIG. 1B and FIG. 2. FIG. 1A depicts a cross section and a bottom view of a device 102 whereas a FIG. 1B shows a bottom view of said device. The device 102 comprises a fluid chamber 104, which fluid chamber 104 has a bottom 106 and a wall having wall parts 108, 110, 112 and 114, see also FIG. 1B. The wall parts 108, 110, 112 and 114 are provided with an insulating layer 116 for preventing shortcuts, see FIG. 1A. In alternative embodiments the fluid chamber may have a conical or a cylindrical wall, or any other suitable wall. The device 102 further comprises a main electrowetting electrode 118, which is attached to the bottom 106 in this particular embodiment, and auxiliary electrowetting electrodes 120, 122, 124 and 126, see FIG. 1B, which partially surround the fluid chamber 104 and are attached to the wall parts 108, 110, 112 and 114, respectively. In this particular example, the main plane 119 and the auxiliary planes 121, 123, 125 and 127 do not coincide.

Referring to FIG. 1A, the fluid chamber 104 comprises a first fluid 128 and a second fluid 130, which first and second fluids are mutually immiscible and define a fluid meniscus 132 being an interface between the fluids 128 and 130. The first fluid 128 is electrically conductive and the second fluid 130 is electrically insulating. That is, first fluid 128 has a first electrical conductivity and the second fluid 130 has a second electrical conductivity, wherein the second electrical conductivity is significantly small compared to first electrical conductivity. Ideally, the second electrical conductivity is nihil. Preferably, a first fluid's density and a second fluid's density have no significant mutual difference as to make the device 102 relatively insensitive to changes of its orientation with respect to the gravity field.

During operation, voltages V1, V2, V3 and V4 are provided to the respective auxiliary electrowetting electrodes 120, 122, 124 and 126 by a voltage source 134 at frequencies f1, f2, f3 and f4, respectively. Herein, it holds that f1≠f2≠f3≠f4. Through providing said voltages to the auxiliary electrowetting electrodes 120, 122, 124 and 126, a geometry of the fluid meniscus 132 is controlled via controlling contact angles $\phi_1$ and $\phi_2$ see FIG. 1A. The contact angle $\phi_1$ is defined as the angle between the fluid meniscus 132 and the wall part 108, the contact angle $\phi_2$ is accordingly defined as being the angle between the fluid meniscus 132 and the wall part 112, see FIG. 1B. In this embodiment, the object is to generate an inclined straight fluid meniscus, as indicated in FIG. 1A. The contact angles are controlled through employing the electrowetting effect. The contact angles are estimated through measuring the capacitances between the main electrowetting electrode 118 and each of the auxiliary electrowetting electrodes 120, 122, 124 and 126. Namely, the aforementioned capacitances are determined by the dimensions of the areas 136 and 138 of the electrowetting electrodes covered with the electrically conductive first fluid 128, wherein the areas 136 and 138 covered with the electrically conductive first fluid 128 vary proportionally with said contact angles. Contact angles between the fluid meniscus 132 and the wall parts 110 and 114 are equally being controlled.

In this particular example, the device 102 is mounted in a catheter's tip 140 for the purpose of real time controlling the direction of an ultrasound beam 142 generated by an ultrasound transducer 144, as depicted in FIG. 1A. For that purpose, the first fluid provides a first speed of sound and the second fluid provides a second speed of sound, wherein the first speed of sound differs from the second speed of sound. The discontinuity in terms of speeds of sound occurring at the fluid meniscus 132 will redirect the ultrasound beam. Hence, through controlling the fluid meniscus' tilt angle, the ultrasound beam 142 is being steered towards a target location inside e.g. a human body. For more detailed information, the reader is referred to WO 2006/035407 A1. The device 102 is not limited to applications in catheters; other promising applications are in endoscopes, biopsy needles and scanning microscopes.

Because of the catheter tip's relatively small dimensions, a measurement circuit 144 and the voltage source 134 cannot be integrated with the catheter's tip 140. Consequently, the measurement circuit 144 and the voltage source 134 are remotely located from the catheter's tip 140. The measurement circuit 144 is arranged for separately measuring the capacitances between the main electrowetting electrode 118 and the auxiliary electrowetting electrodes 120, 122, 124 and 126 on the basis of a signal 153. The signal 153 is indicative for the capacitances between the main electrowetting electrode 118 and each of the auxiliary electrowetting electrodes 120, 122, 124 and 126, which capacitances are denoted by $C_1$, $C_2$, $C_3$ and $C_4$, respectively, see FIG. 1A and FIG. 1B. Hence in this particular example, each of the auxiliary electrowetting electrodes 120, 122, 124 and 126 are considered by the measurement circuit 144. The measurement circuit 144 and the voltage source 134 are physically connected to the electrowetting lens 102 by way of co-axial cables 146, 148, 150, 151 and 152. Although said co-axial cables are shielded such that no mutual coupling between the co-axial cables exists, the co-axial cables 146, 148, 150, 151 and 152 introduce significant parasitic capacitors having parasitic capacitances $C_{P1}$, $C_{P2}$, $C_{P3}$, $C_{P4}$ and $C_{P5}$. The parasitic capacitances are non-constant due to bending movements of the co-axial cables 146, 148, 150, 151 and 152 during use. It is noted that the cables 146, 148, 150 and 151 may be embodied by common electrically insulated cables, between which cables parasitic capacitances may come into being.

FIG. 2 illustrates a model for the electrical behavior of the device 102. In addition, FIG. 2 depicts the measurement circuit 144 applied in the device of FIGS. 1A and 1B in more detail. For the purpose of separately measuring the capacitances $C_1$, $C_2$, $C_3$ and $C_4$, a measurement circuit 202 comprises an operational amplifier 204 provided with a negative feedback loop 206, which feedback loop is provided with a measurement capacitor 208 having a measurement capacitance $C_{meas}$. The operational amplifier's positive input $V_+$ is grounded. Due to the negative feedback loop 206, the negative input $V_-$ of the operational amplifier 204 is at virtual ground, i.e. it holds that $V_-=V_+$. The latter implies that $V_-=0$ [V]. Although currents will flow through the parasitic capacitances $C_{P1}$, $C_{P2}$, $C_{P3}$, $C_{P4}$, the voltages across the capacitances $C_1$, $C_2$, $C_3$ and $C_4$ are equal to $V_1$, $V_2$, $V_3$ and $V_4$, respectively. Currents flowing through $C_1$, $C_2$, $C_3$ and $C_4$ will not flow through $C_{P5}$ since this capacitance is connected to the operational amplifier's negative input $V_-$ which is at virtual ground. Therefore a voltage characterizing a signal 210, which signal 210 is representative for the capacitances between the main electrowetting electrode 118 and the auxiliary electrowetting electrodes 120, 122, 124 and 126, follows from the following equation:

$$j\omega C_{meas}V_{meas}=\Sigma_1^{k=4}i_k=i_1+i_2+i_3+i_4=j\omega C_1V_1+j\omega C_2V_2+j\omega C_3V_3+j\omega C_4V_4 \quad [1],$$

wherein ω corresponds to the imaginary part of the Laplace variable and denotes the imaginary unit. Furthermore, $V_{meas}$ is the voltage measured across the known capacitance $C_{meas}$ employing a Voltmeter known per se.

The measurement circuit 202 further comprises a multiplexer 212 which employs frequency domain multiplexing in this particular example. Alternatively, time domain multiplexing may be utilized. The operational amplifier 204 cooperates with an input 211 of the multiplexer 212. The multiplexer 212 duplicates the signal 210 which is representative for the capacitances $C_1$, $C_2$, $C_3$ and $C_4$, to a plurality of signals 214, 216, 218 and 220 which are each representative for said capacitances. The number of duplications corresponds to the number of auxiliary electrowetting electrodes. After duplication, the signals 214, 216, 218 and 220 are demodulated using demodulation signals having frequencies $f_1$, $f_2$, $f_3$ and $f_4$, respectively. The frequencies of the demodulation signals are identical to the frequencies at which the auxiliary electrowetting electrodes 120, 122, 124 and 126, see FIG. 1B, are being driven by the voltage source 134. The demodulation signals may be sinusoidal. Alternatively, the demodulation signals may be embodied by square waves or any other suitable waveform. The frequencies $f_1$, $f_2$, $f_3$ and $f_4$ are such that after demodulation, merely one frequency component of the signals 214, 216, 218 and 220, see FIG. 2, is demodulated to DC i.e. 0 [Hz], whereas possible other frequency components present in demodulated signals 222, 224, 226 and 228 are sufficiently far removed from 0 [Hz], e.g. at least 100 [Hz].

During operation the demodulated signals 222, 224, 226 and 228 are filtered through low-pass filters 230, 232, 234 and 236 respectively, having cut-off frequencies such that the demodulated signals' DC components are unaffected whereas higher frequency contents are effectively attenuated. Low-pass filtered signals 238, 240, 242 and 244 are characterized by voltages $V_{meas,1}$, $V_{meas,2}$, $V_{meas,3}$ and $V_{meas,4}$ which voltages relate to the capacitances $C_1$, $C_2$, $C_3$ and $C_4$, respectively, according to the following relation:

$$j\omega C_{meas} V_{meas,k} = j\omega C_k V_k \qquad [2],$$

with $k \in \{1, 2, 3, 4\}$. Therefore, each of the capacitances $C_k$ between the main electrowetting electrode 118 and the auxiliary electrowetting electrodes 120, 122, 124 and 126 can be determined according to the following relation:

$$C_k = \frac{V_{meas,k} C_{meas}}{V_k}, \qquad [3]$$

with $k \in \{1, 2, 3, 4\}$. It is stressed that the first embodiment according to the invention is not necessarily restricted to a number of 4 auxiliary electrowetting electrodes, i.e. the index k is allowed to attain any positive integer, provided said integer is not less than 2.

Referring to FIGS. 1A and 1B, a voltage control circuit 154 is depicted. The voltage control circuit 154 is arranged for the purpose of controlling the voltages $V_1$, $V_2$, $V_3$ and $V_4$ provided to the auxiliary electrowetting electrodes 120, 122, 124 and 126 respectively, based on a control signal 156 provided by the measurement circuit 144, such that an actual geometry of the fluid meniscus 132 conforms to a desired geometry of the fluid meniscus 132. The desired geometry for the geometry of the fluid meniscus 132 is denoted by a contact angle setpoint $\underline{\phi}_{set}$. In this particular embodiment, $\underline{\phi}_{set}$ is a four dimensional vector, comprising references for each of the contact angles $\phi_1$, $\phi_2$, $\phi_3$ (not shown) and $\phi_4$ (not shown) between the fluid meniscus 132 and the wall parts 108, 110, 112 and 114 respectively. The contact angle setpoint $\underline{\phi}_{set}$ is translated into a capacitance setpoint $\underline{C}_{set}$ by way of a translation table 158. The capacitance setpoint $\underline{C}_{set}$ is a four dimensional reference vector for the capacitances $C_1$, $C_2$, $C_3$ and $C_4$, i.e. the capacitances between the main electrowetting electrode and the auxiliary electrowetting electrodes 120, 122, 124 and 126. The translation table 158 may for example be experimentally obtained. At a four dimensional summation point 160, the capacitance setpoint $\underline{C}_{set}$ is compared to a measured capacitance $\underline{C}_{measured}$, wherein $\underline{C}_{measured}$ is a vector comprising the capacitances $C_1$, $C_2$, $C_3$ and $C_4$ as determined by the measurement circuit 144. A controller 162 provides a four dimensional voltage control signal 164 to the voltage source 134, responsive to a difference Δ between and $\underline{C}_{set}$ and $\underline{C}_{measured}$, i.e. $\Delta = \underline{C}_{set} - \underline{C}_{measured}$. The voltage control signal 164 is also provided to the measurement circuit 144 in order to enable said measurement circuit to perform the calculation according to equation [3]. Subsequently the voltage source 134 provides the aforementioned voltages $V_1$, $V_2$, $V_3$ and $V_4$ to the auxiliary electrowetting electrodes 120, 122, 124 and 126, respectively. It is noted that merely for the purpose of this specific embodiment, the voltage control circuit 154 is dedicated to controlling a number of four voltages. That is there is no restriction on the number of voltages controlled the aforementioned voltage control circuit, provided said number is at least two.

Figure 3A:
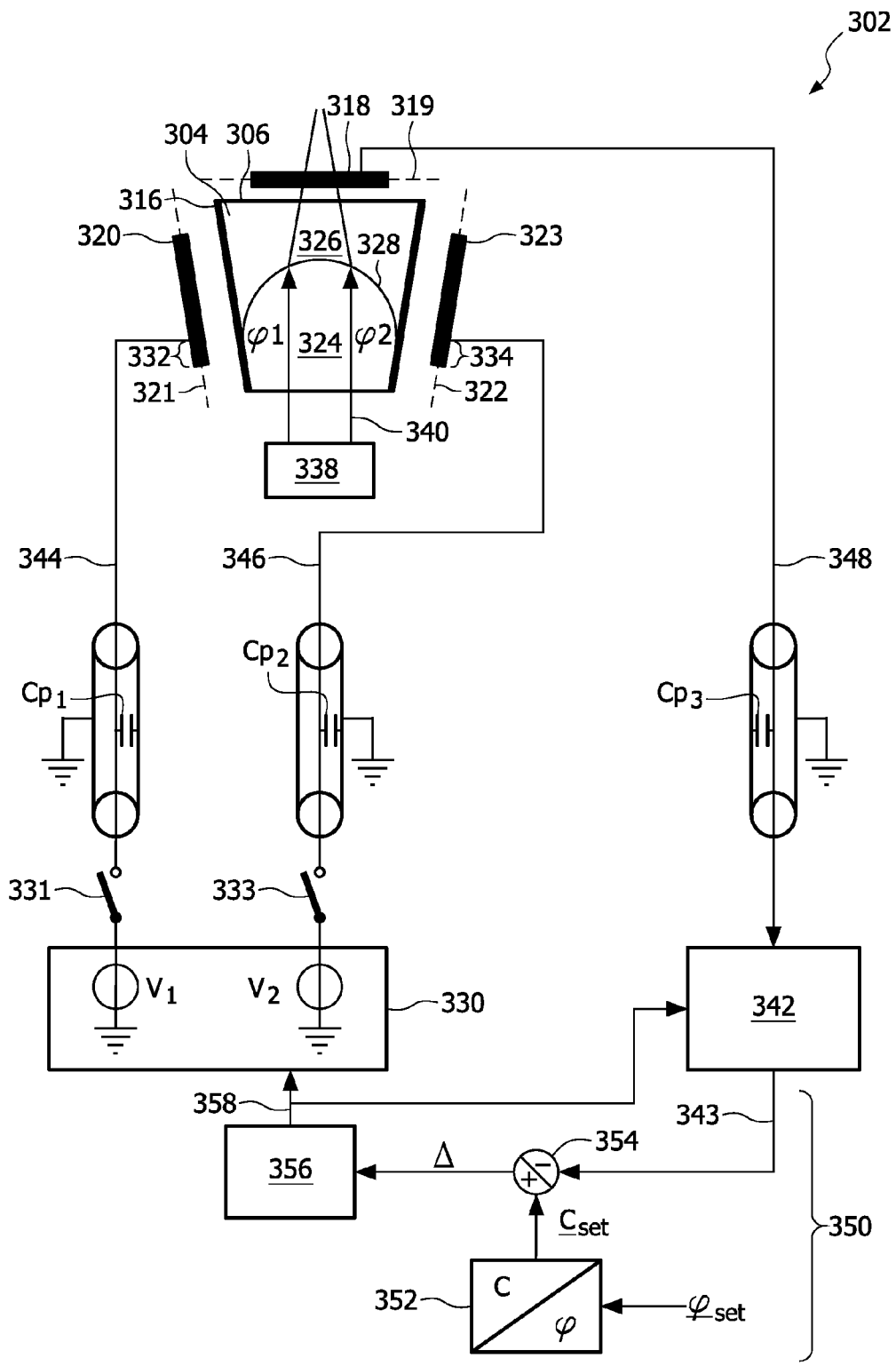
FIG. 3A schematically depicts in cross section a device comprising fluid chamber, a main electrowetting electrode and auxiliary electrowetting electrodes, the device further comprising a measurement circuit provided with a time domain multiplexer.
Figure 3B:
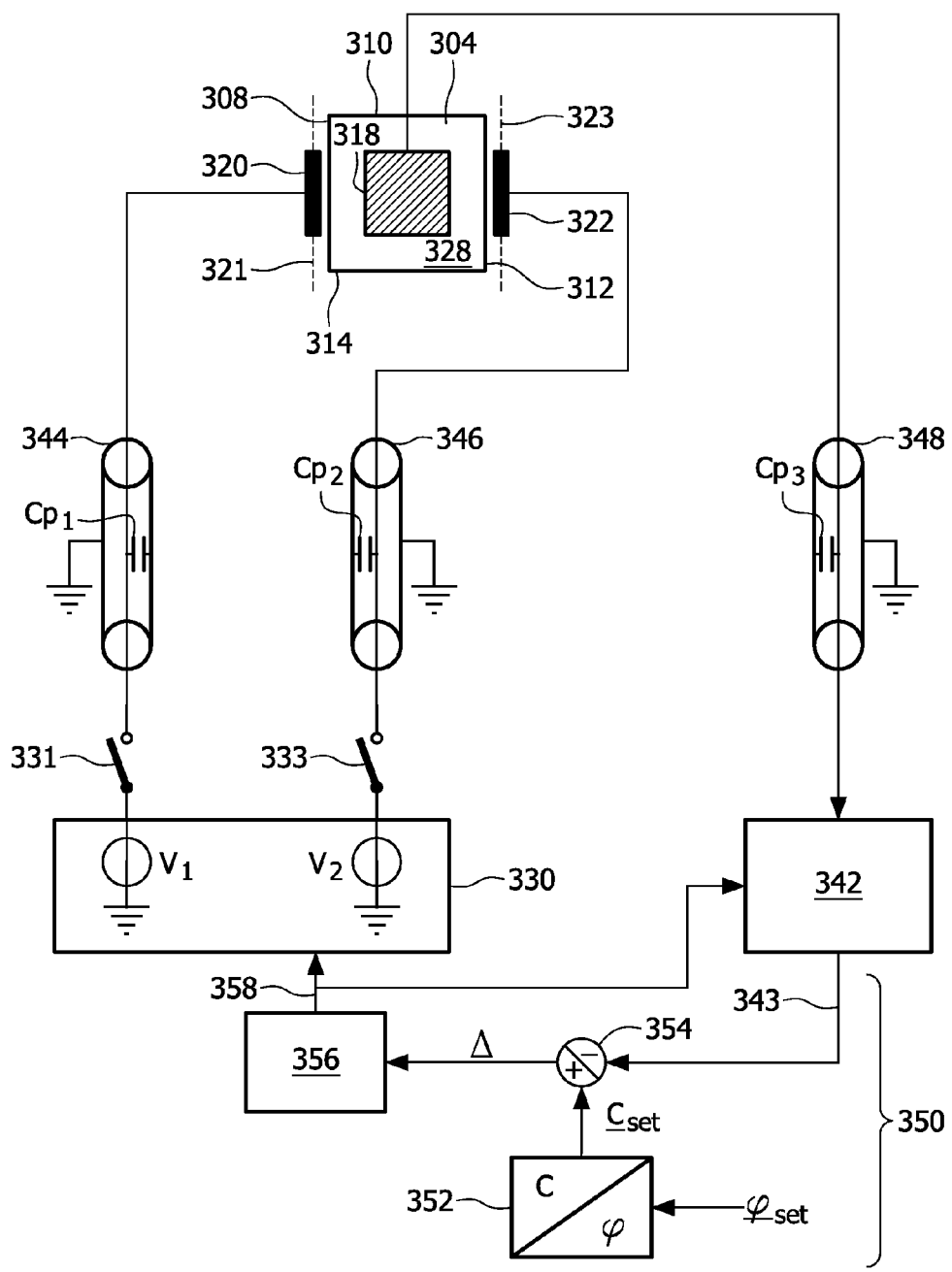
FIG. 3B schematically displays a bottom view of the device depicted in FIG. 3A.
Figure 4:
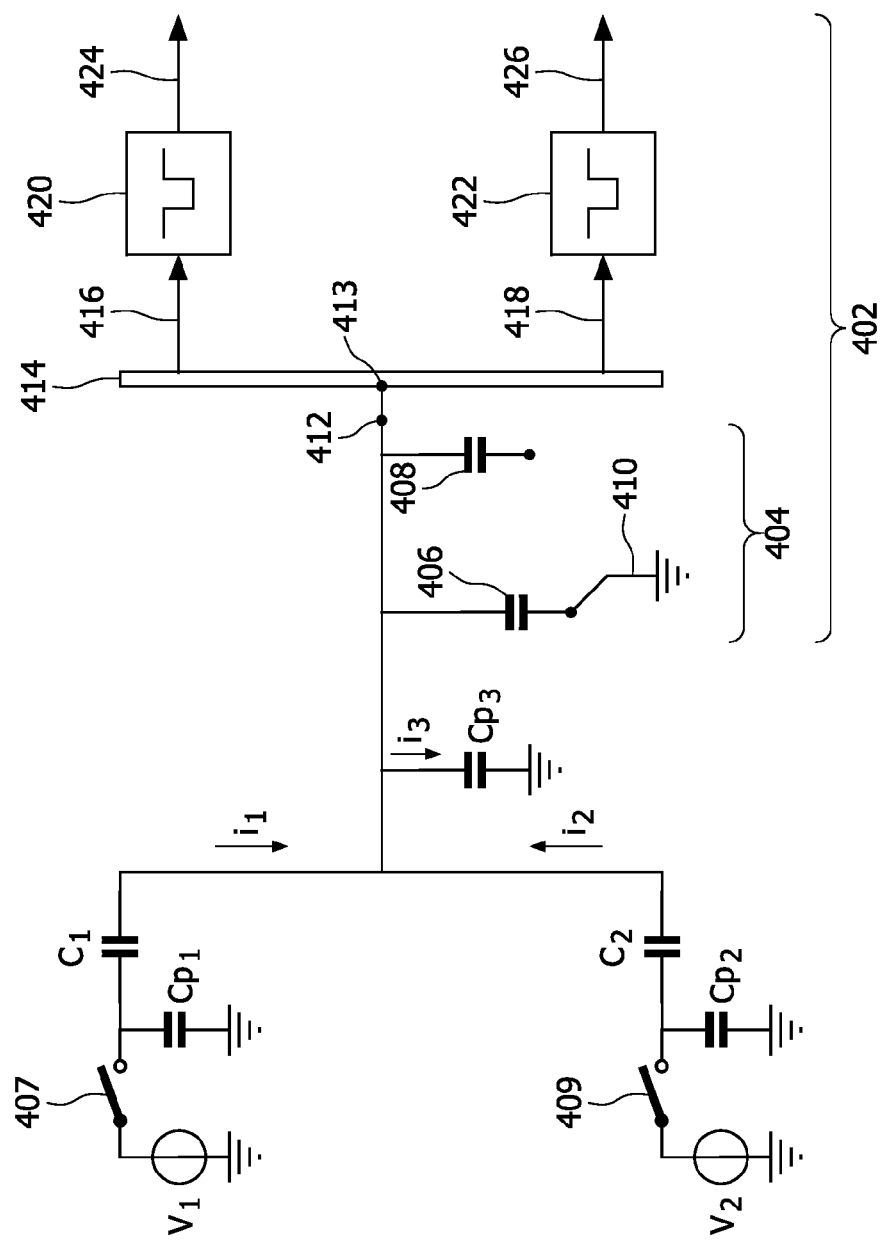
FIG. 4 schematically displays a model for the electrical behavior of an electrowetting lens together with co-axial cables and a measurement circuit, wherein the measurement circuit is applied into the device of FIG. 3A and FIG. 3B.

A second embodiment of the invention is depicted in FIG. 3A, FIG. 3B and FIG. 4. FIG. 3A depicts a cross section of a device 302 whereas FIG. 3B displays a bottom view of said device 302. The device 302 comprises a fluid chamber 304, the fluid chamber 304 having a top 306 and a wall having wall parts 308, 310, 312 and 314, see FIG. 3B. The wall parts 308, 310, 312 and 314 are provided with an insulating layer 316 for preventing shortcuts, see FIG. 3A. In alternative embodiments the fluid chamber 304 may have a conical or a cylindrical wall, or any other suitable wall. The device 302 comprises a grounded main electrowetting electrode 318 attached to the top 306. In this particular example, the device 302 comprises two auxiliary electrowetting electrodes 320 and 322, which partially surround the fluid chamber 304 and which are attached to the wall parts 308 and 312, respectively.

As indicated in FIG. 3A, the fluid chamber 304 comprises a first fluid 324 and a second fluid 326, which first and second fluids are mutually immiscible and are in contact with each other over a fluid meniscus 328. The first fluid 324 is electrically conductive and the second fluid 326 is electrically insulating. That is, first fluid 324 has a first electrical conductivity and the second fluid 326 has a second electrical conductivity, wherein the second electrical conductivity is significantly small compared to first electrical conductivity. Ideally, the second electrical conductivity is nill.

During use voltages $V_1$ and $V_2$ are applied to the auxiliary electrowetting electrodes 320 and 322 by a voltage source 330. Through providing said voltages to the auxiliary electrowetting electrodes 320 and 322, a geometry of the fluid meniscus 328 is controlled via controlling contact angles $\phi_1$ and $\phi_2$. The contact angle $\phi_1$ is defined as the angle between the fluid meniscus 328 and the wall part 308, the contact angle $\phi_2$ is accordingly defined as being the angle between the fluid meniscus 328 and the wall part 312. In this example, it is the object to generate an upwardly facing geometry for the fluid meniscus 328, that is, seen from the bottom of the fluid chamber 304. Said contact angles are controlled through employing the electrowetting effect. The contact angles $\phi_1$ and $\phi_2$ are estimated through measuring the capacitances between the main electrowetting electrode 318 and each of the auxiliary electrowetting electrodes 320 and 322. Namely, the aforementioned capacitances are determined by the dimensions of the areas 332 and 334 of the electrowetting electrodes covered with the electrically conductive first fluid 324, wherein the areas 332 and 334 covered with the electrically conductive first fluid 324, proportionally change with the contact angles $\phi_1$ and $\phi_2$. The voltages $V_1$ and $V_2$ are alternatingly disconnected by way of a first voltage switch 331 and a second voltage switch 333, respectively. During a period of time $t_1$, voltage $V_1$ is connected whereas voltage $V_2$ is disconnected. During a period of time $t_2$, voltage $V_2$ is connected whereas voltage $V_1$ is not connected. Hence, one of the auxiliary electrowetting electrodes 320 and 322 is driven at a time, i.e. the periods $t_1$ and $t_2$ are consecutively recurring.

In this embodiment, the device 302 is mounted in an optical storage drive for the purpose of real time controlling the direction of a laser beam 338 generated by the laser 340, see FIG. 3A. For that purpose, the first fluid 324 has a first refractive index and the second fluid 326 has a second refractive index, wherein the first and second refractive are mutually different. The discontinuity in terms of refractive indices occurring at the fluid meniscus 328 will redirect the laser beam 338 provided by the laser 340. Hence, through controlling the contact angles $\phi_1$ and $\phi_2$, the laser beam 338 is being focused towards a target location on e.g. an optical storage disc.

A measurement circuit 342 and the voltage source 330 are remotely located from the electro wetting lens 302, as depicted in FIGS. 3A and 3B. The measurement circuit 342 is arranged for separately measuring the capacitances between the main electrowetting electrode 318 and the auxiliary electrowetting electrodes 320 and 322, which capacitances are denoted by $C_1$ and $C_2$, respectively. The measurement circuit 342 and the voltage source 330 are physically connected to the device 302 preferably by way of co-axial cables 344, 346 and 348. Although the co-axial cables 344, 346 and 348 are shielded such that no mutual coupling between the co-axial cables comes into being, said co-axial cables introduce significant parasitic capacitors having capacitances $C_{P1}$, $C_{P2}$ and $C_{P3}$. Said parasitic capacitances are non-constant due bending movements of the co-axial cables 344, 346 and 348 during use.

FIG. 4 depicts a model for the electrical behavior of the device 302. In addition, FIG. 4 depicts the measurement circuit 342 applied in the device of FIGS. 3A and 3B in more detail. For the purpose of separately measuring the capacitances $C_1$ and $C_2$, a measurement circuit 402 comprises a switching circuit 404. The switching circuit 404 comprises a first measuring capacitor 406 having a known capacitance $C_{meas}$, and a second measurement capacitor 408 having a known capacitance $xC_{meas}$, wherein $x \neq 1$. The switching circuit 404 further comprises a capacitance switch 410 for driving the first and second measurement capacitors 406 and 408 in an alternating and mutually excluding way. By way of a first voltage switch 407 and a second voltage switch 409, the voltages $V_1$ and $V_2$ are alternatingly disconnected, respectively.

During period $t_1$, it holds that $V_2$ is not connected. During a first part of period $t_1$ the capacitance switch 410 enables the first measurement capacitor 406, during a second part of period $t_1$ the capacitance switch 410 enables the second measurement capacitor 408. Therefore during the first part of period $t_1$, a voltage $V_{meas1}$, which voltage characterizes a signal 412 during the first part of period $t_1$, the signal 412 being representative for the capacitances $C_1$ and $C_2$, is given by the following equation:

$$j\omega C_1(V_1-V_{meas1})=j\omega(C_{p3}+C_{R2})V_{meas1}+j\omega C_{meas}V_{meas1} \quad [4],$$

wherein $C_{R2}$ denotes the resultant capacity due to $C_{P2}$ and $C_2$, which resultant capacity is defined according to the following equation:

$$C_{R2} = \frac{C_2 C_{P2}}{C_2 + C_{P2}}. \quad [5]$$

Likewise, in case the second measurement capacitor 408 is enabled, the following expression is obtained for a voltage $V_{meas2}$, which voltage is characterizing the signal 412 during the second part of period $t_1$:

$$j\omega C_1(V_1-V_{meas2})=j\omega(C_{p3}+C_{R2})V_{meas2}+j\omega x C_{meas}V_{meas2} \quad [6].$$

Considering equations [4] and [6], the resultant capacity $C_{R2}$ is assumed to remain constant during period $t_1$. Period $t_1$ is associated with a sample frequency of typically 1 kHz to 1 MHz, which is a frequency significantly larger than the bandwidth of the first and second fluids 324 and 326 comprised in the fluid chamber 304. Hence, the latter assumption is justified and consequently, it does not reduce an accuracy associated with the measuring of the capacitances $C_1$ and $C_2$. Combining equations [4] and [6], a system of two linear equations is obtained. The latter system incorporates two unknowns, i.e. the capacitance $C_1$ and the parasitic capacitance $C_{p3}$. Said system of linear equations can be solved for the unknown capacitance $C_1$, which solution is given by the following equation:

$$C_1 = \frac{(x-1)C_{meas}V_{meas1}V_{meas2}}{V_1(V_{meas1}-V_{meas2})}. \quad [7]$$

During a first part of period $t_2$ the capacitance switch 410 enables the first measurement capacitor 406, during a second part of period $t_2$ the capacitance switch 410 enables the second measurement capacitor 408. During period $t_2$, it holds that $V_1$ is disconnected. Therefore during the first part of period $t_2$, a voltage $V_{meas3}$, which voltage characterizes the signal 412 during a first part of period $t_2$, is given by the following equation:

$$j\omega C_2(V_2-V_{meas3})=j\omega(C_{p3}+C_{R1})V_{meas3}+j\omega C_{meas}V_{meas2} \quad [8],$$

wherein $C_{R1}$ denotes the resultant capacity due to $C_{P1}$ and $C_1$, which resultant capacity is defined according to the following equation:

$$C_{R1} = \frac{C_1 C_{P1}}{C_1 + C_{P1}}. \quad [9]$$

Likewise, in case the second measurement capacitor 408 is enabled, the following expression is obtained for a voltage $V_{meas4}$, which voltage is characterizing the signal 412 during the second part of period $t_2$:

$$j\omega C_2(V_2-V_{meas4})=j\omega(C_{p3}+C_{R1})V_{meas4}+j\omega x C_{meas}V_{meas4} \quad [10].$$

Considering equations [8] and [10], the resultant capacity $C_{R1}$ is assumed to remain constant during period $t_2$. Like period $t_2$, period $t_1$ is associated with a sample frequency of typically 1 kHz to 1 MHz, which is a frequency significantly larger than the bandwidth of the first and second fluids 324 and 326 comprised in the fluid chamber 304. Hence, the latter assumption is justified and consequently, it does not reduce an accuracy associated with the measuring of the capacitances $C_1$ and $C_2$. Combining equations [8] and [10], a system of two linear equations is obtained, the system incorporating two unknowns namely the capacitance $C_2$ and the parasitic capacitance $C_{p3}$. The latter system of linear equations can be solved for the unknown capacitance $C_2$, which solution is given by the following equation:

$$C_2 = \frac{(x-1) Cmeas Vmeas3 Vmeas4}{V_2(Vmeas3 - Vmeas4)} \quad [11]$$

The measurement circuit 402 further comprises a multiplexer 414 which employs time domain multiplexing. The switching circuit 404 cooperates with an input 413 of the multiplexer 414. The multiplexer 414 duplicates the signal 412 which is representative for the capacitances $C_1$ and $C_2$, to a plurality of signals 416 and 418 which are each indicative for the capacitances $C_1$ and $C_2$. The number of duplications corresponds to the number of auxiliary electrowetting electrodes. After duplication, the signals 416 and 418 are demodulated by demodulation signals by filters 420 and 422, respectively. The filters 420 and 422 are driven by demodulation signals, in this particular case the demodulation signals are square wave signals. Here a square wave signal is considered a signal that can attain two values; a low value and a high level. In this particular example, the low value is set equal to zero. A first square wave signal driving the filter 420 attains its high value during period $t_1$ whereas a second square wave signal driving the filter 422 attains its high value during period $t_2$. Hence, the first square wave signal attains its high value when voltage $V_1$ is connected whereas the second square wave signal attains its high value when $V_2$ is connected. As a result, demodulated signals 424 and 426 can only be related to the capacitances $C_1$ and $C_2$, respectively.

It is noted that the switching circuit 404 not necessarily comprises a pair of measurement capacitors, that is, a pair of measurement resistors having known and mutually different resistances or a pair of measurement inductors having known and mutually different inductances, are feasible as well. More generally, linear electronic measurement elements will be feasible. Herein a linear electronic measuring element is defined as a passive electronic element, i.e. an electronic element obeying a linear relation between a current and a voltage, between a current and a time-derivative of a voltage or between a time-derivative of a current and a voltage. The equations [4] up to and including [11] will be different as a result.

Referring to FIGS. 3A and 3B, a voltage control circuit 350 is depicted. The voltage control circuit 350 is arranged for the purpose of controlling the voltages $V_1$ and $V_2$ provided to the auxiliary electrowetting electrodes 318 and 320 respectively, based on a control 343 signal provided by the measurement circuit 342, such that an actual geometry of the fluid meniscus 328 conforms to a desired geometry of the fluid meniscus 328, see FIG. 3A.

The desired geometry for the geometry of the fluid meniscus 328 is denoted by a contact angle setpoint $\phi_{set}$, wherein $\phi_{set}$ is a two dimensional vector in case of this specific embodiment, comprising references for each of the contact angles $\phi_1$ and $\phi_2$ between the fluid meniscus 328 and the wall parts 308 and 312 respectively. The contact angle setpoint $\phi_{set}$ is translated into a capacitance setpoint $\underline{C}_{set}$ by way of a translation table 352. In this specific example, the capacitance setpoint $\underline{C}_{set}$ is a two dimensional vector comprising references for the capacitances $C_1$ and $C_4$, i.e. the capacitances between the main electrowetting electrode 318 and the auxiliary electrowetting electrodes 320 and 322. The translation table 352 may for example be experimentally obtained. At a two-dimensional summation point 354, the capacitance setpoint $\underline{C}_{set}$ is compared to a measured capacitance $\underline{C}_{measured}$, wherein $\underline{C}_{measured}$ is a two dimensional vector comprising the capacitances $C_1$ and $C_2$ as determined by the measurement circuit 342. A controller 356 provides a two dimensional voltage control signal 358 to the voltage source 330, responsive to a difference $\Delta$ between $\underline{C}_{set}$ and $\underline{C}_{measured}$, i.e. $\Delta = \underline{C}_{set} - \underline{C}_{measured}$. Subsequently the voltage source 330 provides the aforementioned voltages $V_1$ and $V_2$ to the auxiliary electrowetting electrodes 320 and 322 respectively. The voltage control signal 358 is also provided to the measurement circuit 342 in order to enable said measurement circuit to perform the calculation according to equations [7] and [11].

Figure 5:
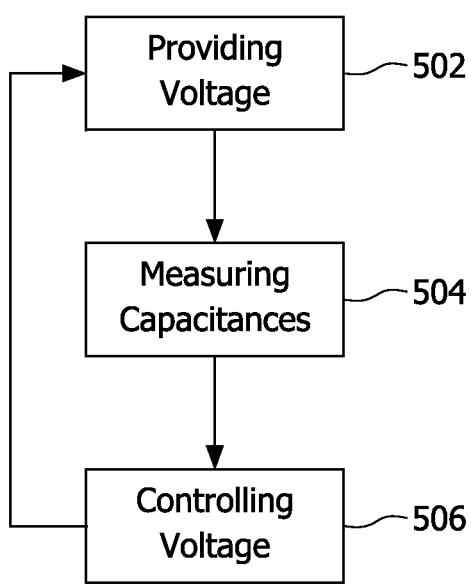
FIG. 5 depicts a flowchart representing a method for measuring a geometry of a fluid meniscus.

FIG. 5 schematically depicts an embodiment of the method according to the invention by way of a flowchart. The method is arranged for measuring a geometry of a fluid meniscus between an electrically conducting first fluid and an electrically insulating second fluid comprised in a fluid chamber, wherein the fluids are mutually immiscible.

The method comprises a step 502 of providing a voltage between a main electrowetting electrode located in a main plane and auxiliary electrowetting electrodes partially surrounding the fluid chamber and being located in an auxiliary plane not being the main plane. The method further comprises a step 504 of separately measuring capacitances between the main electrowetting electrode and at least two of the auxiliary electrowetting electrodes by a measurement circuit comprising a multiplexer. The method comprises a step 506 of controlling the voltage provided between the auxiliary electrowetting electrodes based on a signal provided by the measurement circuit.

While the invention has been illustrated and described in detail in the drawings and in the foregoing description, the illustrations and the description are to be considered illustrative or exemplary and not restrictive. The invention is not limited to the disclosed embodiments. For instance, the device and the method according to the invention impose no restriction on the number of auxiliary electrowetting electrodes, provided this number is not less than 2. Furthermore, the first fluid's speed of sound as well as the first fluid's refractive index may be different from the second fluid's speed of sound and the second fluid's refractive index, respectively. In addition to that, a measurement comprising an operational amplifier provided with a negative feedback loop, which negative feedback loop is provided with a measurement capacitance, wherein the operational amplifier is arranged for cooperation with an input of the multiplexer, may be employed together with time domain multiplexing. It is noted that the device to the invention and all its components can be made by applying processes and materials known per se. In the set of claims and the description the word "comprising" does not exclude other elements and the indefinite article "a" or "an" does not exclude a plurality. Any reference signs in the claims should not be construed as limiting the scope. It is further noted that all possible combinations of features as defined in the set of claims are part of the invention.

The invention claimed is:

1. A device for measuring a geometry of a fluid meniscus, comprising:
   a fluid chamber having a wall and comprising electrically conductive and electrically insulating fluids mutually immiscible and in contact with each other over the fluid meniscus, the wall and the fluid meniscus forming a contact angle;
   a main electrowetting electrode in a main plane and a plurality of auxiliary electrowetting electrodes partially surrounding the fluid chamber in respective auxiliary planes;

a voltage source configured to provide voltages between the main electrowetting electrode and the plurality of auxiliary electrowetting electrodes at respective different frequencies, to thereby control the contact angle via the electrowetting effect; and a measurement circuit configured to separately measure capacitances between the main electrowetting electrode and at least two of the plurality of auxiliary electrowetting electrodes, and including a multiplexer configured to demodulate a signal indicative of said respective capacitances using demodulation signals comprising the respective different frequencies thereby decomposing the signal into respective signal components, wherein dimensions of areas of the auxiliary electrowetting electrodes covered with the electrically conductive fluid change with the contact angle and indicate respective capacitances.

2. The device according to claim 1, wherein the measurement circuit is arranged for measuring capacitances between the main electrowetting electrode and each of the plurality of auxiliary electrowetting electrodes.

3. The device according to claim 1, further comprising a voltage control circuit for controlling the voltage provided between the main electrowetting electrode and each of the auxiliary electrowetting electrodes based on a control signal provided by the measurement circuit.

4. The device according to claim 1, wherein the measurement circuit comprises:
   an operational amplifier configured to
      measure capacitances between the main electrowetting electrode and at least two of the plurality auxiliary electrowetting electrodes, and
      cooperate with an input of the multiplexer;
   a negative feedback loop; and
   a measurement capacitor having a predetermined measurement capacitance.

5. The device according to claim 1, wherein the measurement circuit comprises:
   a switching configured to cooperate with an input of the multiplexer and to measure capacitances between the main electrowetting electrode and at least two of the plurality of auxiliary electrowetting electrodes and including
      a first measurement capacitor having a predetermined first measurement capacitance, and
      a second measurement capacitor having a predetermined second measurement capacitance, the first and second measurement capacitances are mutually different, and
      a capacitance switch for driving the first and second measurement capacitors in an alternating way.

6. The device according to claim 1, wherein the multiplexer is a time domain multiplexer that employs a square wave demodulation signal having a low value and a high value, wherein the voltage source comprises voltage switches for alternatingly disconnecting the voltages corresponding to the high values.

7. The device according to claim 1, wherein the multiplexer is a frequency domain multiplexer configured to employ demodulation signals having a frequency component corresponding to the respective frequencies.

8. The device according to claim 1, wherein the electrically conductive fluid has a first refractive index and the electrically insulating fluid has a second refractive index different from the first refractive index.

9. The device according to claim 1, wherein the electrically conductive fluid provides a first speed of sound and the electrically insulating fluid provides a second speed of sound different from the first speed of sound.

10. The device according to claim 1, wherein the device is a catheter.

11. The device according to claim 1, wherein the device is a catheter used for ultrasound applications.

12. The device according to claim 1, wherein the device is used in an optical storage drive.

13. The device according to claim 1, wherein the device is used in a photo camera.

14. A method for measuring a geometry of a fluid meniscus comprising acts of:
   providing electrically conducting and electrically insulating mutually immiscible fluids in a fluid chamber having a wall, the wall and the fluid meniscus forming a contact angle;
   providing a main electrowetting electrode in a main plane and a plurality of auxiliary electrowetting electrodes partially surrounding the fluid chamber in respective auxiliary planes;
   controlling the contact angle via the electrowetting effect by providing voltages at respective different frequencies between the main electrowetting electrode and the plurality of auxiliary electrowetting electrodes;
   measuring by a measurement circuit comprising a multiplexer capacitances between the main electrowetting electrode and at least two of the a plurality of auxiliary electrowetting electrodes; and
   demodulating a signal indicative of said respective capacitances using demodulation signals comprising the respective different frequencies thereby decomposing the signal into respective signal components,
   wherein dimensions of areas of the auxiliary electrowetting electrodes covered with the electrically conductive fluid change with the contact angle and indicate respective capacitances.

15. The method according to claim 14, further comprising an act of controlling the voltage provided to the auxiliary electrowetting electrodes based on a signal provided by the measurement circuit.

* * * * *